United States Patent
Lee et al.

(10) Patent No.: US 8,604,537 B2
(45) Date of Patent: Dec. 10, 2013

(54) NONVOLATILE MEMORY DEVICE AND METHOD OF FABRICATING THE SAME

(75) Inventors: Ki-Hong Lee, Icheon-si (KR); Kwon Hong, Icheon-si (KR)

(73) Assignee: Hynix Semiconductor Inc., Icheon-si, Gyeonggi-do (KR)

(*) Notice: Subject to any disclaimer, the term of this patent is extended or adjusted under 35 U.S.C. 154(b) by 501 days.

(21) Appl. No.: 12/493,820

(22) Filed: Jun. 29, 2009

(65) Prior Publication Data

US 2010/0163963 A1   Jul. 1, 2010

(30) Foreign Application Priority Data

Dec. 26, 2008   (KR) .................. 10-2008-0134788

(51) Int. Cl.
   *H01L 29/792* (2006.01)
(52) U.S. Cl.
   USPC ............... 257/324; 257/E21.21; 257/E29.309
(58) Field of Classification Search
   USPC .................. 257/324, E21.21, E29.309
   See application file for complete search history.

(56) References Cited

U.S. PATENT DOCUMENTS

| | | |
|---|---|---|
| 7,098,504 B2 | 8/2006 | Kawashima et al. |
| 2009/0057750 A1* | 3/2009 | Takashima et al. ........... 257/321 |
| 2009/0085094 A1* | 4/2009 | Lee et al. ...................... 257/321 |
| 2009/0086549 A1* | 4/2009 | Fujiki ..................... 365/185.28 |

FOREIGN PATENT DOCUMENTS

| | | |
|---|---|---|
| KR | 1020020059746 | 7/2002 |
| KR | 100843229 | 6/2008 |
| KR | 10855993 | 8/2008 |
| WO | 02/29902 | 4/2002 |

OTHER PUBLICATIONS

Chinese Office Action for 200910159486.2.
Korean Notice of Allowance for 10-2008-0134788.

* cited by examiner

*Primary Examiner* — Timor Karimy
(74) *Attorney, Agent, or Firm* — Lowe Hauptman & Ham LLP

(57) ABSTRACT

There is provided a nonvolatile memory device having a tunnel dielectric layer formed over a substrate, the charge capturing layer formed over the tunnel dielectric layer and including a combination of at least one charge storage layer and at least one charge trap layer, a charge blocking layer formed over the charge capturing layer, and a gate electrode formed over the charge blocking layer.

8 Claims, 4 Drawing Sheets

33  32C  32B  32A  31

33  32C  32B  32A  31

16
NONVOLATILE MEMORY DEVICE AND METHOD OF FABRICATING THE SAME

CROSS-REFERENCE TO RELATED APPLICATIONS

The present application claims priority of Korean patent application number 10-2008-0134788, filed on Dec. 26, 2008, respectively, which is incorporated herein by reference in its entirety.

BACKGROUND

The present disclosure relates to a nonvolatile memory device and a method of fabricating the same, and more particularly, to a nonvolatile memory device including a charge capturing layer and a method of fabricating the nonvolatile memory device.

A memory device is classified into a volatile memory device and a nonvolatile memory device according to whether data is preserved or not when the power is cut off. The volatile memory device is a memory device data of which is lost when the power is cut off, and its examples include a dynamic random access memory (DRAM) device and a static random access memory (SRAM) device. On the other hand, the nonvolatile memory device is a memory device data of which is preserved even when the power is cut off, and a flash memory device is an example of the nonvolatile memory device.

Hereinafter, the nonvolatile memory device will be explained in detail with reference to a figure.

FIG. 1 illustrates a cross-sectional view of a nonvolatile memory device including a conventional gate pattern.

Referring to FIG. 1, a tunnel dielectric layer 11 is formed on a substrate 10. Herein, the tunnel dielectric layer 11 is provided as an energy barrier for the tunneling of charges and may include an oxide layer.

Then, a charge capturing layer 12 is formed on the tunnel dielectric layer 11. The charge capturing layer 12 is provided as a practical data storage and its threshold voltage is changed by supplying or removing charges to or from the charge capturing layer 12. For instance, in a programming operation, charges of a bulk are supplied to the charge capturing layer 12 through the Fouler-Nordheim tunneling (F—N tunneling) and, in an erasing operation, charges captured in the charge capturing layer 12 are discharged into the bulk by the F-N tunneling, so that the threshold voltage is changed.

Subsequently, a charge blocking layer 13 is formed on the charge capturing layer 12. The charge blocking layer 13 plays a role of preventing the charges from passing through the charge capturing layer 12 and moving into a gate electrode 14.

After forming a conducting layer for a gate electrode 14 on the charge blocking layer 13, the conducting layer 14, the charge blocking layer 13 and the charge capturing layer 12 are sequentially etched. As a result, there is formed a gate pattern including the charge capturing layer 12, the charge blocking layer 13 and the conducting layer 14 that are patterned.

Meanwhile, the nonvolatile memory device is classified into a charge storage type nonvolatile memory device and a charge trap type nonvolatile memory device according to a data storage scheme. The charge storage type nonvolatile memory device includes a charge capturing layer formed with a charge storage layer and the charge trap type nonvolatile memory device includes a charge capturing layer formed with a charge trap layer.

Hereinafter, there will be described an energy band diagram in an erasing operation of each of the charge storage type nonvolatile memory device and the charge trap type nonvolatile memory device.

FIG. 2A illustrates an energy band diagram of a conventional charge storage type nonvolatile memory device.

As shown in FIG. 2A, the charge storage type nonvolatile memory device stores data by storing charges in a conduction band of a charge storage layer and erases data by discharging charges stored in the charge storage layer into the bulk through the F-N tunneling by supplying an erasing voltage to the bulk.

Herein, the data erasing operation by the F-N tunneling is influenced by a potential barrier $\Phi_1$ of the interface between a charge storage layer 12A and a tunnel dielectric layer 11, a thickness W1 of the potential barrier profile, and a voltage drop $-V_1$ of the tunnel dielectric layer 11 that is generated when the erasing voltage is supplied.

If the erasing voltage is supplied to the bulk, the voltage drop $-V_1$ occurs at an interface between a substrate 10 and the tunnel dielectric layer 11 and thus a triangular potential barrier region A is formed. Since the thickness W1 of the potential barrier is relatively small in the triangular potential barrier region A, the charges stored in the charge storage layer 12A are discharged into the substrate 10 by the F-N tunneling, if the voltage drop $-V_1$ has a greater value than the potential barrier $\Phi_1$. Therefore, the charge storage type nonvolatile memory device has a high programming/erasing speed due to the F-N tunneling.

However, because the charge storage type nonvolatile memory device stores the charges in the conduction band, it is prone to interference that is caused by neighboring memory cells. In particular, since the interference effect caused by neighboring memory cells increases as an interval between memory cells is reduced, the conventional charge storage type nonvolatile memory device has a limitation in enhancing the degree of integration of memory devices.

FIG. 2B illustrates an energy band diagram of a conventional charge trap type nonvolatile memory device.

As shown in FIG. 2B, the charge trap type nonvolatile memory device stores data by trapping charges in a deep level trap site in a charge trap layer 12B. Herein, the deep level trap site is generally located in a deeper level than a conduction band (e.g., between the conduction band energy level Ec and the valence band energy level Ev), and the energy level of the trap site can be adjusted by changing the composition of the charge trap layer 12B.

As described above, since the charge trap type nonvolatile memory device traps the charges in the trap site of the charge trap layer 12B, its interference effect caused by neighboring cells becomes less than that of the charge storage type nonvolatile memory device. Therefore, the charge trap type nonvolatile memory device is more appropriate for enhancing the degree of integration of the memory devices than the charge storage type nonvolatile memory device.

However, since the charge trap type nonvolatile memory device performs an erasing operation by de-trapping (①) the charges trapped in the deep level trap site to the conduction band and then discharging the de-trapped charges to the bulk through the F-N tunneling (②), it requires a relatively high erasing voltage in the erasing operation. That is, the charge trap type nonvolatile memory device has a lower erasing speed than the charge storage type nonvolatile memory device.

It is certainly possible to consider a scheme of improving the erasing speed by adjusting the composition ratio of the charge trap layer 12B. However, since the data preserving characteristic and the data erasing speed of the charge trap type nonvolatile memory device establish a trade-off relationship, the data preserving characteristic is deteriorated when increasing the data erasing speed. For instance, in the case that the charge trap layer 12B is formed with a silicon nitride layer, if a percentage of silicon is increased, the erasing speed can be increased while the data preserving characteristic is deteriorated.

Thus, in order to overcome the characteristic deterioration of the memory device due to the interference effect and to further improve the degree of integration of the memory device, there is a need for a charge trap type nonvolatile memory device having a high data erasing speed and an excellent data preserving characteristic, and a method of fabricating the same.

SUMMARY

Embodiments disclosed in the present application are directed to provide a charge trap type nonvolatile memory device and a method of fabricating the same, which are appropriate for increasing a data erasing speed without deteriorating a data preserving characteristic.

In accordance with one embodiment, there is provided a nonvolatile memory device including: a tunnel dielectric layer formed over a substrate; a charge capturing layer formed over the tunnel dielectric layer and including a combination of at least one charge storage layer and at least one charge trap layer; a charge blocking layer formed over the charge capturing layer; and a gate electrode formed over the charge blocking layer.

In accordance with another embodiment, there is provided a method of fabricating a nonvolatile memory device including: forming a tunnel dielectric layer over a substrate; forming a charge capturing layer including a combination of at least one charge storage layer and at least one charge trap layer over the tunnel dielectric layer; forming a charge blocking layer over the charge capturing layer; and forming a conducting layer for a gate electrode over the charge blocking layer.

DESCRIPTION OF EMBODIMENTS

Figure 1:
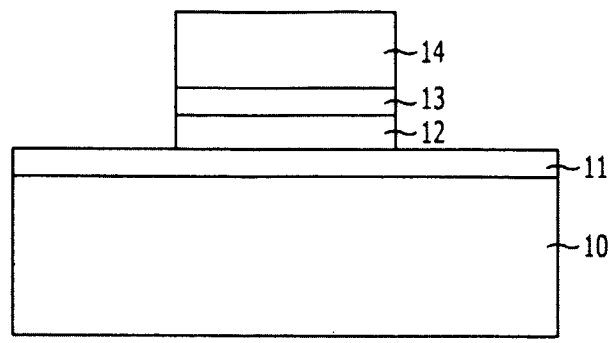
FIG. 1 illustrates a cross-sectional view of a nonvolatile memory device including a conventional gate pattern.
Figure 2A:
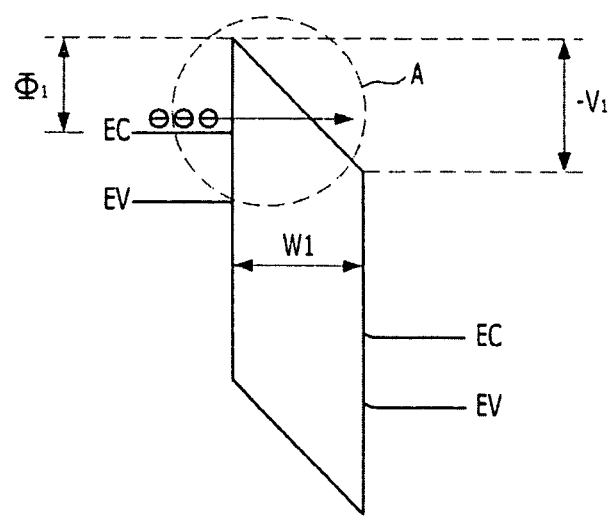
FIG. 2A illustrates an energy band diagram of a conventional charge storage type nonvolatile memory device.
Figure 2B:
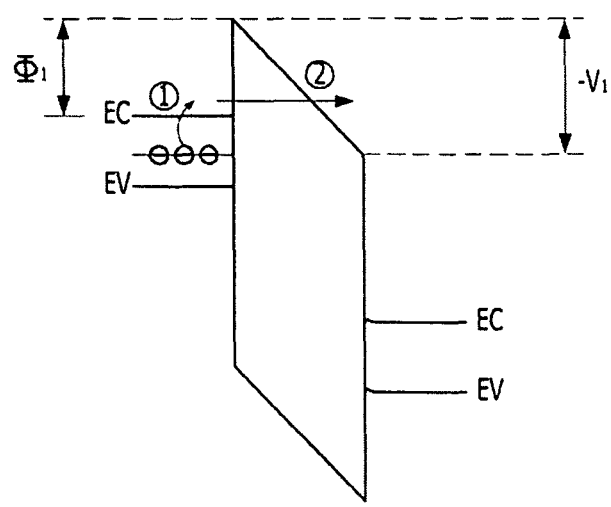
FIG. 2B illustrates an energy band diagram of a conventional charge trap type nonvolatile memory device.

Other objects and advantages of the present disclosure can be understood by the following description, and become apparent with reference to one or more embodiments of the present application. In the figures, the dimensions of layers and regions may be exaggerated for clarity of illustration. Like reference numerals refer to like elements throughout. It will also be understood that when a layer, a film, a region or a plate is referred to as being 'on' another one, it can be directly on the other one, or one or more intervening layers, films, regions or plates may also be present.

Further, although this description explains a charge capturing layer including a charge storage layer and a charge trap layer alternately stacked with each other and a charge capturing layer including a charge storage layer and a charge trap layer surrounding the charge storage layer, it is only for the simplicity of explanation and thus embodiments not limited thereto. One or more embodiments may include charge capturing layers of various structures formed by combining a charge storage layer and a charge trap layer and methods of forming the same.

Figure 3:
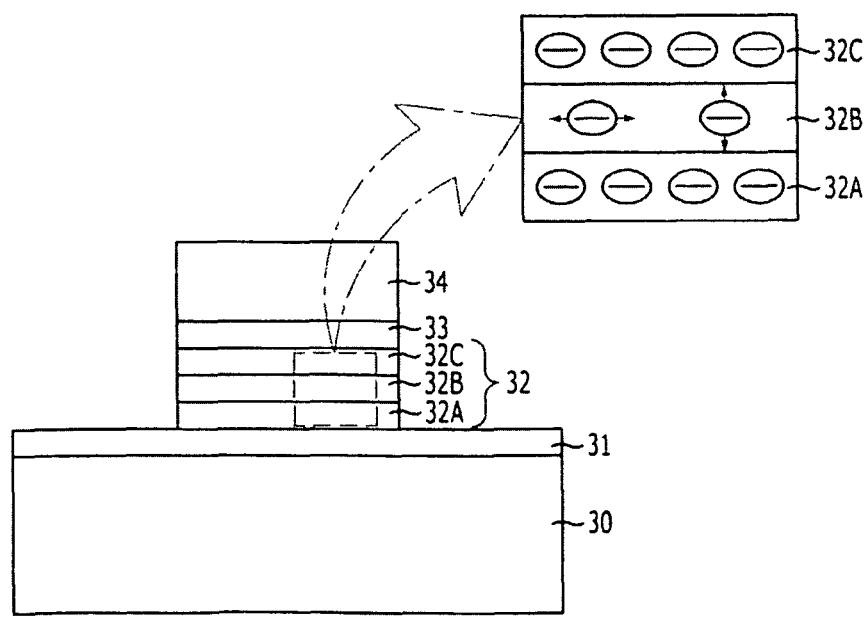
FIG. 3 illustrates a cross-sectional view of a nonvolatile memory device including a gate pattern in accordance with one embodiment.

FIG. 3 illustrates a cross-sectional view of a nonvolatile memory device including a gate pattern in accordance with one embodiment. Hereinafter, a method of forming a charge capturing layer 32 by alternately stacking a charge storage layer and a charge trap layer, specially, a method of fabricating a nonvolatile memory device including the charge capturing layer 32 formed with a first charge trap layer 32A, a charge storage layer 32B and a second charge trap layer 32C will be described.

Referring to FIG. 3, a tunnel dielectric layer 31 is formed over a substrate 30. Herein, the tunnel dielectric layer 31 is provided as an energy barrier for charge tunneling and may include an oxide layer. Further, the process of forming the tunnel dielectric layer 31 may include a thermal oxidation process or a radical oxidation process. The tunnel dielectric layer 31 may have a thickness of approximately 30 Å to approximately 80 Å.

Subsequently, the charge capturing layer 32 including the charge storage layer 32B and the charge trap layers 32A and 32C is formed on the tunnel dielectric layer 31. In this regard, according to one or more embodiments, the charge capturing layer 32 may have the charge storage layer and the charge trap layer alternately stacked with each other. For instance, the charge capturing layer 32 may include a multi-layer formed by repeatedly and alternately stacking the charge storage layer and the charge trap layer such as a multi-layer of charge trap layer/charge storage layer/charge trap layer/charge storage layer/charge trap layer and a multi-layer of charge storage layer/charge trap layer/charge storage layer/charge trap layer. In accordance with one or more embodiments, the uppermost layer of the charge capturing layer 32 may be the charge trap layer. Hereinafter, the process of forming the charge capturing layer 32 will be described in more detail.

First of all, the first charge trap layer 32A is formed on the tunnel dielectric layer 31. The first charge trap layer 32A may include one of a silicon nitride layer, an aluminum oxide layer, a zirconium oxide layer, a hafnium oxide layer, a lanthanum oxide layer, a niobium oxide layer and a combination thereof. The first charge trap layer 32A may have a thickness of approximately 10 Å to approximately 50 Å.

For example, the first charge trap layer 32A may be formed of a silicon nitride layer at a temperature of approximately 400° C. to approximately 800° C. using a $SiH_4$ gas or a $SiC_{12}H_2$ gas, and a $NH_3$ gas through a chemical vapor deposition (CVD) method. Further, the silicon nitride layer may be formed to have a composition ratio of 0.6<N/Si<1.45. That is, the ratio of N to Si may be in a range of approximately 0.6 to approximately 1.45.

Then, the charge storage layer 32B is formed on the first charge trap layer 32A. Herein, the charge storage layer 32B may include one of a polysilicon layer, a germanium layer, a silicon germanium layer and a combination thereof, wherein the silicon germanium layer is a $Si_xGe_{1-x}$ layer having $0<x<1$. Particularly, according to one or more embodiments, the charge storage layer 32B may be formed of a semiconducting material layer the band gap size of which is smaller than those of the charge trap layers 32A and 32C, or a conductive material layer made by doping a semiconducting material layer with p-type impurities or n-type impurities.

The charge storage layer 32B may have a thickness of approximately 10 Å to approximately 50 Å. More specifically, it may have a thickness of approximately 20 Å to approximately 30 Å.

For instance, the charge storage layer 32B may be formed of a polysilicon layer at a temperature of approximately 400° C. to approximately 800° C. using a $SiH_4$ gas, a $SiC_{12}H_2$ gas or a $Si_3H_8$ gas through the CVD method. Moreover, the polysilicon layer may be doped with n-type impurities such as P, As and Sb or p-type impurities such as B, Al, Ga and In and the doping concentration may be in a range of approximately $10^{18}$ atoms/cm$^3$ to approximately $10^{21}$ atoms/cm$^3$.

After then, the second charge trap layer 32C is formed on the charge storage layer 32B. Herein, the second charge trap layer 32C may include one of a silicon nitride layer, an aluminum oxide layer, a zirconium oxide layer, a hafnium oxide layer, a lanthanum oxide layer, a niobium oxide layer and a combination thereof. The second charge trap layer 32C may have a thickness of approximately 10 Å to approximately 50 Å.

For instance, the second charge trap layer 32C may be formed of a silicon nitride layer at a temperature of approximately 400° C. to approximately 800° C. using a $SiH_4$ gas or a $SiC_{12}H_2$ gas, and a $NH_3$ gas through the CVD method. Further, the silicon nitride layer may be formed to have a composition ratio of $0.6<N/Si<1.45$. That is, a ratio of N to Si may be in a range of approximately 0.6 to approximately 1.45.

As a result of the above processes, there is formed the charge capturing layer 32 including the first charge trap layer 32A, the charge storage layer 32B and the charge trap layer 32C that are sequentially stacked with each other. The charge capturing layer 32 may have a thickness of approximately 50 Å to approximately 150 Å. Based on the charge capturing layer as described, it is possible to increase a data erasing speed without deteriorating a data preserving characteristic.

Subsequently, a charge blocking layer 33 is formed on the charge capturing layer 32. The charge blocking layer 33 plays a role of preventing charges from passing through the charge capturing layer 32 and moving into a gate electrode 34.

The charge blocking layer 33 may be formed with a high-k material such as $Al_2O_3$, HfAlO, LaAlO, DyScO, GdScO, AlZrO and $ZrO_2$. In particular, the charge blocking layer 33 may be formed with one of an aluminum oxide layer and a silicon oxide layer, or a stacked structure thereof. Further, the charge blocking layer 33 is formed using a CVD method or a sputtering method. The charge blocking layer 33 may have a thickness of approximately 80 Å to approximately 150 Å.

Then, a conducting layer for the gate electrode 34 is formed on the charge blocking layer 33. The conducting layer 34 may include one of a doped polysilicon layer, a tungsten silicide layer, a titanium nitride layer, a tantalum nitride layer, a tungsten nitride layer and a stacked structure thereof.

The conducting layer 34, the charge blocking layer 33 and the charge capturing layer 32 are sequentially etched. Thus, there is formed the gate pattern including the charge capturing layer 32, the charge blocking layer 33 and the conducting layer 34 that are patterned.

Hereinafter, the structure of the charge capturing layer 32 will be described in more detail. As enlarged in FIG. 3, the charge capturing layer 32 includes a stacked structure of the charge storage layer 32B and the charge trap layers 32A and 32C.

Since it has the above structure, the charge capturing layer 32 can store data by trapping charges as well as by storing them. That is, in the charge storage layer 32B, the charges are stored in a conduction band and, in the charge trap layers 32A and 32C, the charges are trapped in a deep level trap site, so that the data are stored.

As such, in the case of forming the charge capturing layer 32 by combining the charge storage layer 32B and the charge trap layers 32A and 32C, it is possible to reduce the thicknesses of the charge trap layers 32A and 32C compared to the prior art and thus to discharge the charges trapped in the deep level trap site of the charge trap layers 32A and 32C to the bulk through the direct tunneling. Accordingly, it is not required to perform a de-trapping process and thus it is possible to reduce an erasing voltage compared to the prior art. In particular, since the charge storage layer 32B functions as a bridge for the charge movement, a charge trap type nonvolatile memory device according to one or more embodiments can have an erasing speed higher than that of a conventional charge trap type nonvolatile memory device.

Moreover, since the movement of the charges stored in the charge storage layer 32B is restricted by the increase of a potential barrier due to the charges trapped in the charge trap layers 32A and 32C, the data preserving characteristic of a charge trap type nonvolatile memory device according to one or more embodiments is not deteriorated although it partially includes the charge storage layer 32B. Also, since the interference effect caused by neighboring cells is blocked by the charges stored in the charge trap layers 32A and 32C surrounding the charge storage layer 32B, a charge trap type nonvolatile memory device according to one or more embodiments is almost not affected by the interference effect like a conventional charge trap type nonvolatile memory device although the charge trap type nonvolatile memory device partially includes the charge storage layer 32B.

Consequently, it is possible to provide the charge trap type nonvolatile memory device the data erasing speed of which is increased without the deterioration of the data preserving characteristic by forming the charge capturing layer 32 including the combination of the charge storage layer 32B and the charge trap layers 32A and 32C.

Figure 4A:
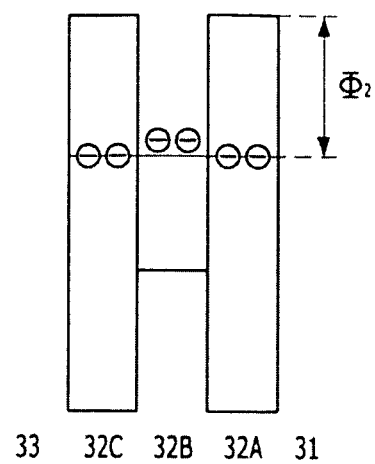
FIGS. 4A and 4B illustrate energy band diagrams of a charge capturing layer in accordance with one embodiment.
Figure 4B:
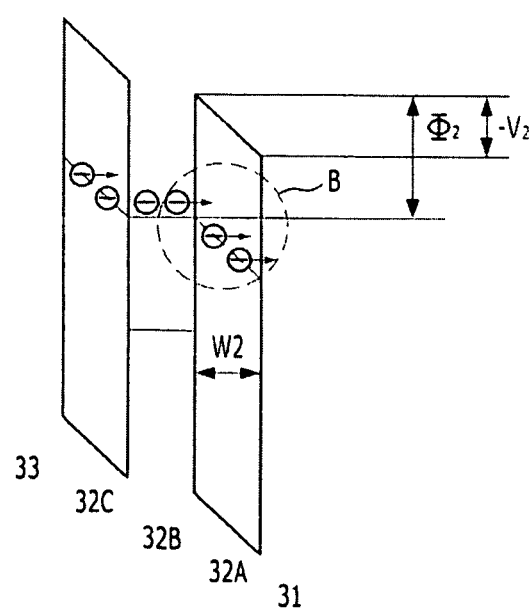

FIGS. 4A and 4B illustrate energy band diagrams of the charge capturing layer 32 in accordance with one embodiment. Hereinafter, data programming and erasing operations of the nonvolatile memory device including the charge capturing layer 32 formed with the combination of the charge storage layer 32B and the charge trap layers 32A and 32C will be described with reference to the energy band diagrams.

FIG. 4A illustrates an energy band diagram of the charge capturing layer 32 where charges are supplied in a programming operation.

As shown in FIG. 4A, when capturing the charges in the charge capturing layer 32 by supplying a programming voltage to the gate electrode 34, the charges are stored in the conduction band of the charge storage layer 32B, and are also trapped in the deep level trap site of the charge trap layers 32A and 32C.

Herein, an energy level of the trap site can be adjusted by the composition ratio of the charge trap layer. For instance, in the case that the charge trap layers 32A and 32C are formed with a silicon nitride layer and the charge storage layer 32B is formed with a polysilicon layer, the charge storage layer 32B can be formed to have the conduction band the energy level of which is substantially the same as that of the trap site of the charge trap layers 32A and 32C.

At this time, since the potential barrier $\Phi_{OX}$ of the interface between the charge storage layer 32B and the charge trap layers 32A and 32C is increased by the charges trapped in the charge trap layers 32A and 32C, it is possible to prevent the loss of the charges stored in the charge storage layer 32B due to the vertical or horizontal movement of the charges. That is, although a charge trap type nonvolatile memory device according to one or more embodiments partially includes the charge storage layer 32B, its data preserving characteristic is not deteriorated compared to a conventional charge trap type nonvolatile memory device.

For instance, in the case of forming the charge capturing layer 32 by combining the charge trap layers 32A and 32C made of a silicon nitride layer and the charge storage layer 32B made of a polysilicon layer, it is noted that the potential barrier $\Phi_{OX}$ of the interface between the charge storage layer 32B and the charge trap layers 32A and 32C has approximately 2.4 eV and thus the data preserving characteristic is not deteriorated.

FIG. 4B illustrates an energy band diagram of the charge capturing layer 32 in an erasing operation. As shown in FIG. 4B, if the erasing voltage is supplied to the bulk, a voltage drop $-V_2$ occurs at the interface between the first charge trap layer 32A and the tunnel dielectric layer 31.

At this time, since the first charge trap layer 32A is formed to have a smaller thickness than the charge trap layer of a conventional charge trap type nonvolatile memory device, the thickness of the potential barrier profile at the first charge trap layer 32A is relatively small. Further, the charge storage layer 32B has the conduction band the energy level of which is substantially the same as that of the trap site of the charge trap layers 32A and 32C and the charge storage layer 32B functions as a bridge in the erasing operation.

Therefore, although the voltage drop $-V_2$ is smaller than the potential barrier $\Phi_2$, the charges trapped in the first charge trap layer 32A are discharged into the substrate 30 in a trapezoidal potential barrier region B by the direct tunneling. Namely, when the erasing voltage is supplied, the charges trapped in the second charge trap layer 32C are directly tunneled to the charge storage layer 32B, and the charges stored in the charge storage layer 32B and the charges trapped in the first charge trap layer 32A are directly tunneled to the substrate 30. As a result, the erasing speed of the charge trap type nonvolatile memory device according to one or more embodiments can be increased compared to a conventional charge trap type nonvolatile memory device.

Figure 5:
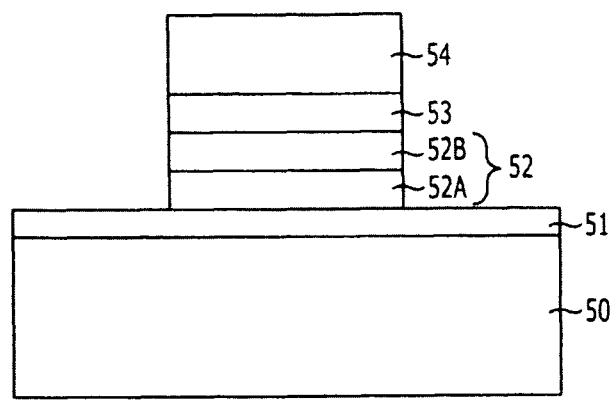
FIG. 5 illustrates a cross-sectional view of a nonvolatile memory device including a gate pattern in accordance with another embodiment.

FIG. 5 illustrates a cross-sectional view of a nonvolatile memory device including a gate pattern in accordance with another embodiment. Hereinafter, a process of forming a charge capturing layer 52 by alternately stacking a charge storage layer and a charge trap layer and, particularly, a process of forming the charge capturing layer 52 including a charge storage layer 52A and a charge trap layer 52B will be described. The detailed description of the process may be the same as that of FIG. 3.

Referring to FIG. 5, a tunnel dielectric layer 51 is formed over a substrate 50. Herein, the tunnel dielectric layer 51 may be formed to have a greater thickness than the prior art. More specifically, the tunnel dielectric layer 51 may have a thickness of approximately 40 Å to approximately 80 Å. As a result, it is possible to prevent charges stored in the charge storage layer 52A from being lost through the tunnel dielectric layer 51.

Then, after forming the charge storage layer 52A on the tunnel dielectric layer 51, the charge trap layer 52B is formed on the charge storage layer 52A, so that the charge capturing layer 52 is formed. At this time, the charge capturing layer 52 may be formed to have a thickness ratio of the charge trap layer 52B to the charge storage layer 52A that is in a range of approximately 1 to approximately 3. The thickness ratio being 3 means that the thickness of the charge storage layer 52A to that of the charge trap layer 52B is 1:3.

Herein, the charge storage layer 52A is formed by performing a chemical vapor deposition process, but the charge storage layer 52A may be formed of a polysilicon layer acquired by performing a crystallization and oxidization of an amorphous silicon layer. Hereinafter, the crystallization and oxidization of an amorphous silicon layer will be described.

An amorphous silicon layer is formed to have a certain thickness over the tunnel dielectric layer 51. For instance, the amorphous silicon layer may be formed to have a thickness ranging from approximately 50 Å to approximately 100 Å.

The amorphous silicon layer may be formed at a temperature ranging from approximately 480° C. to approximately 550° C. using silane ($SiH_4$) gas or disilane ($Si_2H_6$) gas in a high-temperature low-pressure batch type furnace. Otherwise, an amorphous silicon layer, not doped with impurities, may be formed using a single wafer type chamber, or an amorphous silicon layer, doped with impurities, may be formed using phosphine ($PH_3$) gas. At this time, the rate of charge storage and erasure of the memory device may be controlled by controlling the impurity doping concentration level.

The amorphous silicon layer is crystallized and oxidized using an oxidation process. The amorphous silicon layer is crystallized to form a polysilicon layer and, at substantially the same time, is oxidized to form an oxide layer. The upper portion may be oxidized without oxidizing the bottom portion by controlling the oxidation process. As a result, a thin layer structure which includes the non-oxidized remaining polysilicon thin layer in the bottom portion and the oxide layer in the upper portion may be formed.

Therefore, it may be possible to form an oxide layer having a uniform thickness by performing an oxidation process to crystallize and form the oxide layer at substantially the same time, while forming the remaining polysilicon thin layer with a uniform thickness. For instance, the remaining polysilicon thin layer may be formed to have a thickness ranging from approximately 10 Å to approximately 50 Å.

The oxidation process of the amorphous silicon layer may be performed at a temperature ranging from approximately 700° C. to approximately 1,000° C. using a high-temperature low-pressure oxidation method. Also, the oxidation process may be performed using a wet, dry, or radical oxidation method.

A wet etch process is performed to remove the oxide layer using the remaining polysilicon thin layer as an etch stop layer. For instance, the wet etch process may be performed using hydrogen fluoride (HF) or buffer oxide etchant (BOE), and thus, the remaining polysilicon thin layer may be formed to have a thickness ranging from approximately 10 Å to approximately 50 Å over the tunnel dielectric layer 51. Consequently, the charge storage layer 52A having a uniform thickness is formed.

After forming a charge blocking layer 53 and a conducting layer for a gate electrode 54 on the charge capturing layer 52, the conducting layer 54, the charge blocking layer 53 and the charge capturing layer 52 are etched to form the gate pattern including the charge capturing layer 52, the charge blocking layer 53 and the conducting layer 54 that are patterned.

Figure 6:
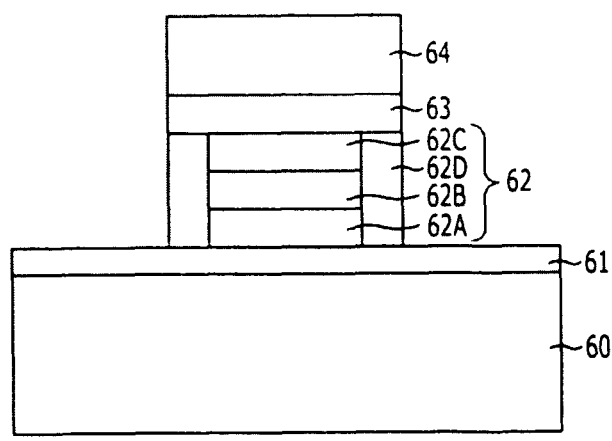
FIG. 6 illustrates a cross-sectional view of a nonvolatile memory device including a gate pattern in accordance with yet another embodiment.

FIG. 6 illustrates a cross-sectional view of a nonvolatile memory device including a gate pattern in accordance with yet another embodiment. Hereinafter, there will be described a process of forming a charge capturing layer 62 including a charge storage layer and a charge trap layer surrounding the charge storage layer and, particularly, a process of forming the charge capturing layer 62 including a charge storage layer 62B, charge trap layers 62A and 62C and an oxide layer 62D, wherein the charge storage layer 62B and the charge trap layers 62A and 62C are alternately stacked and the oxide layer 62D is formed on sidewalls of the charge storage layer 62B and the charge trap layers 62A and 62C. The detailed description of the process may be the same as that of FIG. 3.

As shown in FIG. 6, there is formed the gate pattern including the first charge trap layer 62A, the charge storage layer 62B, the second charge trap layer 62C, a charge blocking layer 63 and a gate electrode 64 that are patterned. Although FIG. 6 shows an instance that the first charge trap layer 62A, the charge storage layer 62B and the second charge trap layer 62C are stacked, this is an embodiment and thus the charge storage layer and the charge trap layer may be stacked to have various structures.

Then, through an oxidation process, the oxide layer 62D is formed on the sidewalls of the charge storage layer 62B and the charge trap layers 62A and 62C. At this time, the oxidation process may include a plasma oxidation process or a radical oxidation process.

As a result of the above processes, there is formed the charge capturing layer 62 including the charge storage layer 62B and the charge trap layers 62A and 62C that are alternately stacked, and the oxide layer 62D that is formed on the sidewalls of the charge storage layer 62B and the charge trap layers 62A and 62C. That is, the charge capturing layer 62 is formed with the charge storage layer 62B and the charge trap layers 62A, 62C and 62D surrounding the charge storage layer 62B.

Therefore, it is possible to further reduce the interference effect caused by neighboring cells and the movement of the charges stored in the charge storage layer 62B, which can increase the data erasing speed of the charge trap type nonvolatile memory device without the deterioration of the data preserving characteristic.

In other words, in accordance with one or more embodiments, the charge capturing layer is formed as a combination of the charge storage layer and the charge trap layer. In this case, the thickness of the charge trap layer becomes smaller than that in the prior art and the charge storage layer functions as a bridge when charges move, so that the data erasing speed may be enhanced.

Further, since the potential barrier at the interface between the charge storage layer and the charge trap layer is increased by the charges trapped in the charge trap layer and thus the vertical and horizontal movement of the charges stored in the charge storage layer can be restricted, the data preserving characteristic is not deteriorated.

Accordingly, it is possible to increase the data erasing speed of the charge trap type nonvolatile memory device without deteriorating the data preserving characteristic. As a result, the degree of integration of the memory device can be enhanced.

While examples and embodiments have been described in the present disclosure, it will be apparent to those skilled in the art that various changes and modifications may be made without departing from the spirit and scope of the disclosure as defined in the following claims.

What is claimed is:

1. A nonvolatile memory device, comprising:
    a tunnel dielectric layer formed over a substrate;
    a first charge trap layer formed over the tunnel insulating layer, wherein the first charge trap layer is formed of an insulating material;
    a charge storage layer formed over the first charge trap layer, wherein the charge storage layer is formed of a semiconducting material or a conductive material;
    a second charge trap layer formed over the charge storage layer, wherein the second charge trap layer is formed of an insulating material;
    a charge blocking layer formed over the second charge trap layer and directly contacting the second charge trap layer; and
    a gate electrode formed over the charge blocking layer.

2. The nonvolatile memory device of claim 1, wherein a band gap size of the charge storage layer is smaller than those of the first charge trap layer and the second charge trap layer.

3. The nonvolatile memory device of claim 1, wherein the charge storage layer comprises a conducting layer obtained by doping a semiconducting material layer with p-type impurities or n-type impurities.

4. The nonvolatile memory device of claim 3, wherein a doping concentration of the charge storage layer is substantially in a range of $10^{18}$ atoms/cm$^3$ to $10^{21}$ atoms/cm$^3$.

5. The nonvolatile memory device of claim 1, wherein the charge storage layer comprises one of a polysilicon layer, a germanium layer, a silicon germanium layer and a combination thereof, wherein the silicon germanium layer is a $Si_xGe_{1-x}$ layer having $0<x<1$.

6. The nonvolatile memory device of claim 1, wherein the first charge trap layer or the second charge trap layer comprises one selected from the group consisting of a silicon nitride layer, an aluminum oxide layer, a zirconium oxide layer, a hafnium oxide layer, a lanthanum oxide layer, a niobium oxide layer and a combination thereof.

7. The nonvolatile memory device of claim 1, wherein the first charge trap layer or the second charge trap layer is formed with a silicon nitride layer, and a ratio of nitride to silicon is substantially in a range of 0.6 to 1.45.

8. The nonvolatile memory device of claim 1, wherein types of charges trapped in the first and the second charge trap layers and stored in the charge storage layer are same.

* * * * *